United States Patent [19]

Sevilla

[11] 4,430,643
[45] Feb. 7, 1984

[54] BINARY-CODED-DECIMAL TO BINARY CONVERTER

[75] Inventor: Ernesto G. Sevilla, Herkimer, N.Y.

[73] Assignee: International Computers Limited, London, England

[21] Appl. No.: 400,849

[22] Filed: Jul. 22, 1982

Related U.S. Application Data

[63] Continuation of Ser. No. 171,972, Jul. 24, 1980, abandoned.

[51] Int. Cl.³ .............................................. G06F 5/02
[52] U.S. Cl. ............................. 340/347 DD; 235/311
[58] Field of Search ............... 340/347 DD; 235/310, 235/311

[56] References Cited

U.S. PATENT DOCUMENTS

| | | | | |
|---|---|---|---|---|
| 3,882,483 | 5/1975 | Burke | .................................. | 235/311 |
| 4,325,056 | 4/1982 | Wiener | ........................ | 340/347 DD |
| 4,331,951 | 5/1982 | Flora | ........................... | 340/347 DD |

Primary Examiner—C. D. Miller
Attorney, Agent, or Firm—Hane, Roberts, Spiecens & Cohen

[57] ABSTRACT

A binary-coded-decimal to binary converter employs a selection network to which the binary coded decimal digits are applied, the digits being selected in pairs of increasing order of decimal denominational significance to be passed to the address lines of a pair of memory elements, the locations of which contain the binary terms equivalent to the decimal digits from which the particular location address is derived. In order to increase the effective utilization of the memory elements, the binary code components specifying at least one of the decimal digits are manipulated by the selection network, for example by conversion to complementary form, before being applied to the address lines. The notional capacity of the locations in terms of the number of binary denominations specifiable may be increased by separately generating bits of higher denominational significance, and this separate generation may take the form of a logic gating operation applied either to generate a binary term directly or to re-allocate the denominational significances of bit positions within a location.

4 Claims, 3 Drawing Figures

BINARY-CODED-DECIMAL TO BINARY CONVERTER

This application is a continuation of application Ser. No. 171,972, filed July 24, 1980, abandoned.

BACKGROUND OF THE INVENTION

The present invention relates to apparatus for converting values expressed in decimal form in which each decimal digit is expressed in binary code notation into a form in which the value is expressed entirely in binary notation.

It is well-known, for example, in connection with data processing apparatus to require such conversion. Typically data for application to such apparatus is expressed in decimal notation, and for ease of manipulation, for example for entry into the apparatus, each decimal digit is separately encoded into binary notation. However, data processing apparatus is frequently arranged so that its internal calculating transactions take place on values expressed entirely in binary code. Thus it is a requirement that the decimal values expressed by means of separately encoded digits shall be converted into a pure binary form.

It has previously been proposed to carry out this conversion by resolving each decimal digit into its binary code components and then summing the resultant components. It will be realised that the process of resolution is required to take into account the decimal denominational significance of each digit, so that, for example, the value 2 occurring in the units denomination results in a single binary component $2^1$; whereas the same value, 2, occurring in the tens denomination requires to be expressed by the binary components $2^4$ and $2^2$. The prior proposals for conversion by this resolution process have included so-called "look-up" tables which contain the various binary components required for different digits of the specified decimal denominations. However, with the development of manufacturing techniques for data storage devices, the forms of such devices have changed and it is desirable to utilize such storage devices as are commonly available in quantity for economic reasons. In particular, it is desirable to use memory elements in which the available storage capacity is expressed in a number of addressable locations each containing a predetermined number of bit storage positions. The addresses of the locations are expressed in binary notation and the bit capacity of a location is regulated by reference to a power of two. Thus, for practical purposes, it is typical for a storage element to have a bit capacity of, say, 8, and a total of 512 possible addresses. It will be appreciated, therefore, that using the binary encoded decimal digits to address such a store presents the problem that they are not compatible with the addressing system, with the result that considerable redundancy is inevitable. Moreover the capacity of a storage location is such that fewer positions are available to express binary components in any location than would be required for the expression of the theoretically greatest decimal number that the store could service.

SUMMARY OF THE INVENTION

It is an object of the present invention to reduce the redundancy of the store element referred to above, and a further object of the invention is to increase the effective bit capacity of the storage locations.

According to the invention, binary-coded-decimal to binary conversion apparatus includes means for successively applying representations of binary coded decimal digits in order of denominational significance to address a memory element having a plurality of addressable locations each arranged to store the bits of a binary representation of its address, the bit storage capacity of the locations being less than the number of bits required to express all the binary denominations which may occur in the conversion of all the applied decimal denominations; means responsive to the application of a decimal digit of predetermined significance for separately generating those bits of higher significance than the bit capacity of the location; means for reading out the bits of an addressed location according to their significance and means for summing the bits occurring as the decimal denominations are successively applied.

BRIEF DESCRIPTION OF DRAWINGS

Apparatus embodying the present invention will now be described with reference to the accompanying drawings, in which.

DESCRIPTION OF PREFERRED EMBODIMENTS

Figure 1:
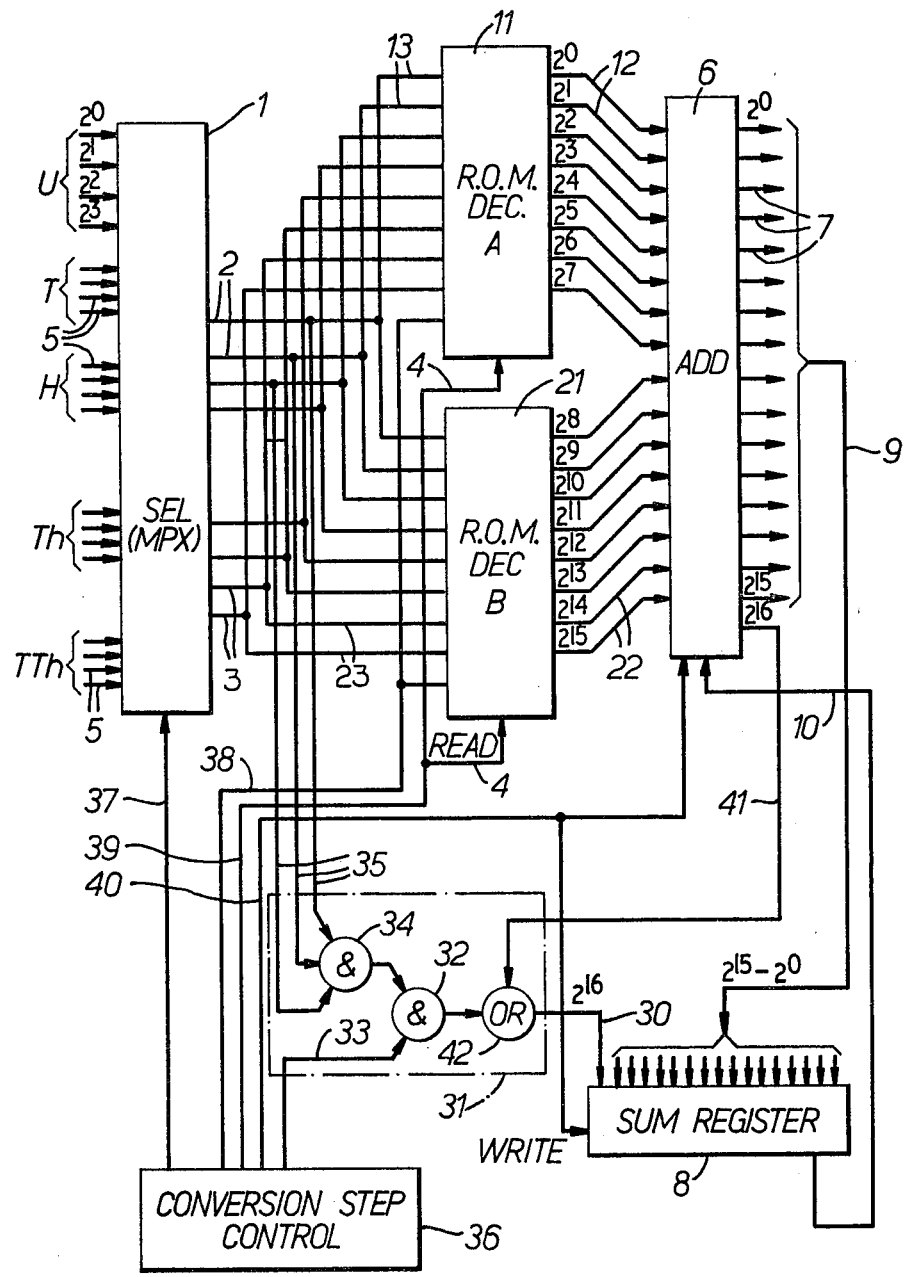
FIG. 1 illustrates, in block schematic form, an arrangement for converting a binary coded decimal value representation into an equivalent value expressed in binary notation.

Referring now to FIG. 1, a conversion arrangement employs a pair of decoding elements 11 and 21. Each of these elements is a 512-word×8-bit read-only memory element having a capacity of 512 addressable storage locations each of which is capable of storing 8 binary digits.

The element 11 has a group of eight output lines 12 and the element 21 has a similar group of eight output lines 22, the lines 12 and 22 carrying the binary digits stored in an addressed location of the respective element. The locations are addressed by signals applied over groups each of nine lines, address lines 13 being provided for element 11 and address lines 23 for element 21, the addresses being specified according to binary code having nine bits. The contents of that location whose address is represented by the bit signals on the address lines 13 and 23 are presented at the output lines 12 and 22 in response to a READ signal on a control line 4 connected to both elements. Of the address lines 13 and 23, which are connected in common, the lines respectively of greatest binary deconominational significance of the two groups are connected to a control line 38. Of the remaining eight lines of each group, those four lines 13,23 of each group having next lower denominational significance are connected respectively one to each of a group of output lines 3 from a selecting network 1, while the remaining four lines 13,23 of least denominational significance of the elements 11,21 are similarly connected to a second group of output lines 2 of the network 1. The network 1 is conveniently a multiplex switching network having input lines 5 arranged in groups of four, each group being associated with a different one of the decimal digits making up the binary-coded decimal value to be converted to an equivalent binary value. As shown in the figure, the decimal digit values represent respectively the units (U), tens(T), hundreds(H), thousands(Th) and ten-thousands(TTh) digits and each digit is expressed by signals on the lines 5 representing the values $2^0$, $2^1$, $2^2$ and $2^3$, the convention being observed in the drawings that these values increase in denominational significance reading downwards.

The output lines 12,22 from the elements 11 and 21 are connected to an adding arrangement consisting of an adder 6 and a sum register 8. The lines 12 from element 11 comprise eight least significant binary denominations $2^0$–$2^7$ and the lines 22 from the element 21 comprise the eight more significant denominations $2^8$–$2^{15}$, both groups of lines 12 and 22 being connected to one group of inputs to the adder 6. Output lines 7 carry sum-component signals representing the denominations $2^0$–$2^{15}$ from the adder 6 to the sum register 8 and a group of lines 10 return the registered sum components to a second group of inputs of the adder 6 to permit the evaluation of a progressive total in conventional manner. An additional output line 41 is provided from the adder 6 to carry signals of greatest significance, representing the denomination $2^{16}$, which can arise, for example, as the result of the summing process, and the line 41 is connected through an OR gate 40 of a logic network 31 and thence over a line 30 to the sum register 8. The OR gate 42 permits the generation of signals representing the denomination $2^{16}$, where required, directly from the outputs 2 of the selecting network 1, and for this purpose a second input to the gate 42 is derived from an AND gate 32. The gate 32 has two inputs; one over a line 33 from a control arrangement 36 and a second from a further AND gate 34. Three inputs 35 are provided for the AND gate 34 and these inputs are respectively derived from those output lines 2 of the network 1 which carry signals representing denominational values of $2^2$, $2^1$ and $2^0$.

The control arrangement 36 consists of a logic network arranged to produce timing signals to enable the various operations of the parts of the conversion arrangement to be synchronised. Thus, the control arrangement 36 will normally form a part of the timing control provided in the data processor with which the conversion arrangement is associated. Thus, typically, the control arrangement 36 provides control signals on control lines 37 to control the operation of the selecting network 1; on the line 38 to provide the ninth, most significant, address signal, of significance $2^8$, to the elements 11 and 21; on a line 39 to provide the read-enable signals to the lines 4 of the elements 11 and 21; over a line 40 to enable the formation of the sum by the adder 6 and the writing of the current total into the sum register 8; and on the line 33 to control the AND gate 32 to generate the $2^{16}$ denomination signal from the outputs 2 of the selecting network 1.

Before considering the operation of the apparatus in detail, the mode of addressing the decoding elements 11 and 21 will be briefly reviewed. The addressing arrangements for both elements are similar, and it will be recalled that each element has 512 addressable locations, the addresses being specified according to binary code and being expressed in nine bits. Of these addresses, the least significant half will be represented with the most significant bit equal to zero, and the more significant half of the addresses have, as their most significant bit, a one. Thus, the remaining eight bits of an address actually specify two storage locations, one in each half of the memory element which makes up each of the decoding elements 11 and 21, and the particular location actually selected will then depend on the value of the ninth bit which effectively selects the required half.

Moreover, since a single decimal digit, expressed in binary code, requires four bits (of significance $2^0$, $2^1$, $2^2$ and $2^3$ respectively), then the remaining eight less significant bits of an address in each of the elements 11 and 21 are made up from the bits of a pair of decimal digits, the binary code components of the decimal digit of less denominational significance occupying the least significant positions, $2^0$ to $2^3$, of the address while those of the more significant decimal digit occupy the next more significant binary denomination positions, $2^4$ to $2^7$. It is also important to appreciate that while the four binary components of a single decimal digit are able to represent sixteen values, only ten, from 0 to 9, are, in fact, required. In particular, this will mean that the sequence of addresses in each half of the element having their less significant bits in the range . . . 1010,0000 to . . . 1111,1111 will not be required for converting a pair of decimal digits.

The operation of the conversion arrangement will now be briefly reviewed. Such operation takes place in six steps under the control of the arrangement 36, each step being performed, for example, in response to an instructional cycle generated by a data processor in conventional manner.

Prior to the commencement of operation, it will be assumed that the digits of the binary-coded-decimal value to be converted are applied, as groups of binary signals on the lines 5, to the input of the selecting network 1, and that the sum register 8 is reset to zero.

During the first step, a signal on a line 37 from the control arrangement 36 is applied to the selecting network 1 to enable the signals on input lines 5 of the two least significant decimal denominations, i.e. units (U) and tens (T), to be connected to the output lines 2 and 3 of the network 1, so that the eight least significant address lines 13, 23, of the elements 11 and 21 respectively carry binary representations of the units and tens digits. During this step a signal is applied to the line 38 so that the ninth address line of the elements 11 and 21 is held at a predetermined level, representing one binary value. Thus, if this predetermined level represents the binary value zero, any location addressed by the signals on lines 13 and 23 will lie in the halves of both elements 11 and 21 having lower significance and will have a remanent address corresponding to the binary significance of the U and T digits of the decimal value to be converted.

A signal is also generated on line 39 by the control arrangement 36 and is passed as a READ signal over line 4 to enable the contents of the particular location in each of the elements 11 and 21 addressed by the applied signals to be read out to the adding arrangement 6. It will be realised that these locations will contain the binary code value corresponding to the applied decimal digits, the resultant converted output being expressed by signals on the output lines 12 and 22 as the $2^0$ to $2^{15}$ components. In fact, of course, at this step, since the decimal values can only lie in the range 00–99, the converted values can only lie in the range $2^0$–$2^7$, so that the output lines 22 from the element 21 are ineffective during this first step.

The control arrangement 36 now initiates the second step of operation, during which it passes a control signal over the line 40 to the adding arrangement 6 and the sum register 8 to enable the adding arrangement 6 to form the sum of the values represented on the lines 12 and 22 with the value currently held in the sum register 8 (at this stage zero), and to allow the resultant sum at outputs 7 to be passed over lines 9 and written into the sum register 8. Once the value has been written into the register 8, the lines 10 enable the value so written to be presented to the adding arrangement 6 in readiness for the next addition operation.

Once the sum has been entered into the sum register 8, the control arrangement 36 proceeds to the third step of operation, during which the selecting arrangement 6 is conditioned by signal on the lines 37 to disconnect the U and T decimal digits from the lines 2 and 3 and to connect instead, the hundreds (H) and thousands (Th) digits. On this step, too, the signal on line 38 is modified to hold the ninth address lines 13 and 23 of the elements 11 and 21 at the appropriate level to represent the opposite binary value so that the locations of the elements 11 and 21 which are addressed lie in the previously unused halves, for example, the more significant halves, of the elements. As in step 1, a READ signal is applied to the elements 11 and 21 by a signal on line 39 from the control arrangements 36, and the contents of the addressed location in each of the elements is read out over the lines 12 and 22 to the adding arrangement 6.

Hence the outputs on lines 12 and 22 represent additional binary code components equal to the H and Th decimal digits, and in the following fourth step the addition of these components to those already entered into the sum register 8 takes place, the fourth step being similar to the second step previously described. At the conclusion of the fourth step, the sum register 8 will then contain the binary equivalent of the value expressed in the Th, H, T and U digits of the decimal value.

The fifth step now follows, and during this step the fifth decimal digit (TTh) is required to be applied to address the elements 11 and 21. It will be realised that in the application of this decimal digit, it is necessary to ensure that the addressed locations within the elements 11 and 21 cannot include those already associated with the conversion of any of the preceding decimal denominations. Thus, while the application of the TTh decimal digit to the output lines 2 of the network 1 will result in the addressing of one of a group of locations whose least significant denominations lie in the range . . . 0000 to . . . 1001, the lines 3 must carry signals such that this group of locations lies in a hitherto unused part of the memory elements constituting the elements 11 and 21. For this purpose the control lines 37 carry signals that will disconnect the H and Th decimal digits from the lines 2 and 3, and, instead, connect the TTh digit to the lines 2, while connecting the lines 3 to a suitable voltage level for example, to simulate bits of value "one". The control line 38 may also be arranged to maintain the most significant address bit at the value "one", and in this way the addresses selectable for the TTh decimal digit will lie in the range 1,1111,0000 to 1,1111,1001, which, as previously noted, are not required for the earlier digit-pairs.

As in the case of the first and third steps described above, the control arrangement 6 also produces the READ signal on lines 39 and 4 so that the conversion value in binary terms is produced at output lines 12 and 22 from the elements 11 and 21. There is, however, an important distinction in the present step. It will be recalled that the binary digits available from the element 21 can occupy only the denominational range from $2^8$ to $2^{15}$. Thus the denomination $2^{16}$ is not directly obtainable from this element, although it is available at the adder 6 if it is generated as the result of an internal carry operation within the adder 6, for example in the case where TTh decimal digit is 6 and the decimal value to be converted exceeds 65536. In this case, the $2^{16}$ bit will be passed over line 41, through OR gate 42 and over line 30 to the sum register in the next step. However, while still considering the present step, it will be seen that if the TTh decimal digit has a value of 7 of more, the $2^{16}$ bit is a direct component of its conversion. Considering only the value 7, FIG. 1 shows an arrangement for the direct derivation of the $2^{16}$ bit. The AND gate 34 of the logic network 31 is arranged, by the connection of its input lines 35 to the lines 2 having denominational significance $2^0$, $2^1$ and $2^2$, to produce an output if the digit represented on the lines 2 has the decimal value 7. The output from the AND gate 34 is passed to AND gate 32, which is conditioned by a signal on line 33, signifying the presence of the TTh decimal digit on the address lines 2, from the control arrangement 36 to allow the gate 32 to pass a signal only during this fifth step. Hence if the TTh digit has the value "7" the output from the AND gate 32 is passed through OR gate 42 to enter the $2^{16}$ bit into the sum register 8. It will be realised that the other decimal digits "8" and "9" in the TTh decimal denomination may also be made to produce the $2^{16}$ bit by additional logic gates similar to the gates 32 and 34.

The final, sixth, step in the conversion is a repetition of the second and fourth steps to permit the addition of the binary components from the fifth step to be added to those produced on the preceding steps, so that at the conclusion of the sixth step, the sum register 8 contains the required conversion, which may then be extracted from the register by conventional read-out connections which are omitted from the Figure.

It will be appreciated from the foregoing description that there are two features of the present apparatus which enable the conversion of more than two pairs of decimal digits by a pair of decoding elements having a restricted address capability. One such feature is the selective modification of decimal digit expressions in binary code to enable the addressing of locations in the decoding elements which would otherwise be unused. The second feature is the development of means for generating binary code components beyond the range of the decoding elements themselves.

Figure 2:
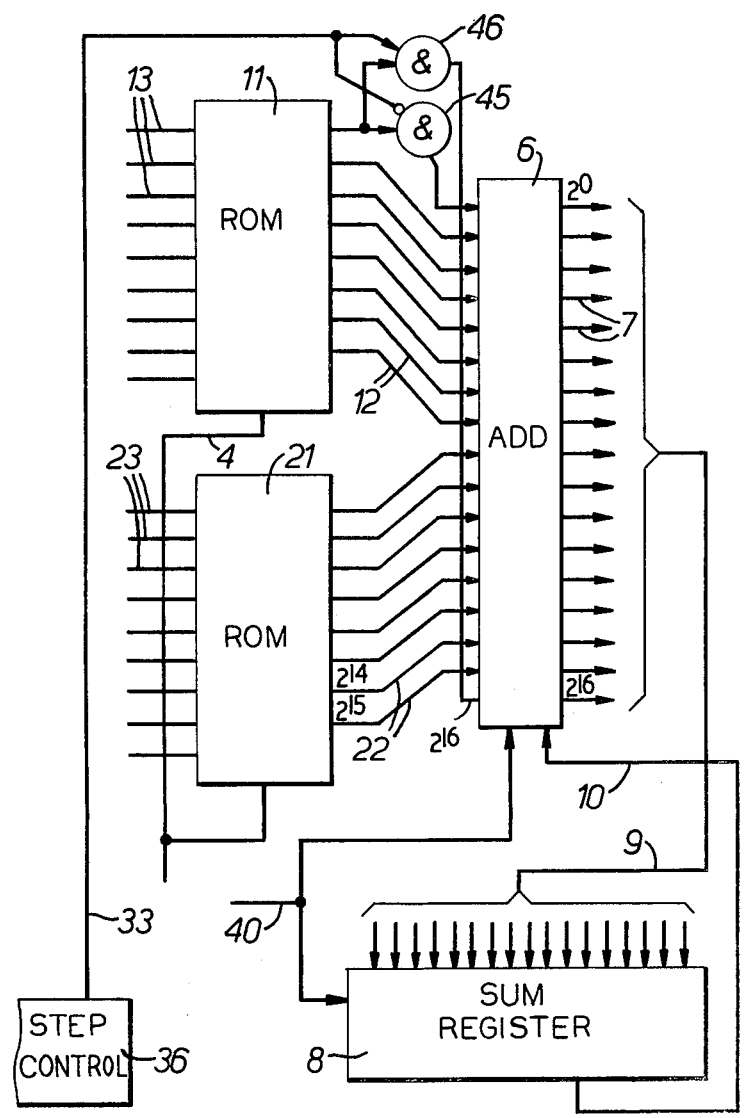
FIG. 2 shows a modification of the arrangement of FIG. 1.

An alternative arrangement for the generation of the $2^{16}$ bit without the need to provide the logic network 31 is shown in FIG. 2, which shows only those components of FIG. 1 as are necessary for the understanding of the modification. This modification is based on the fact that the $2^0$ bit does not occur in the conversion of any decimal digits in the ten-thousands decimal denomination. Accordingly an AND gate 45 is inserted into the $2^0$ bit line 12 from the element 11 to the adder 6. The AND gate 45 is controlled by the occurrence of a bit of binary value one on the $2^0$ line 12 and by the signal on the line 33 from the control arrangement 36. It will be recalled that this signal is present on the line 33 at the time when the TTh decimal digit is being processed, and connection of the line 33 to the AND gate 45 includes an inverter as indicated in the Figure, so that that gate 45 is conditioned to pass signals on the $2^0$ bit line 12 for the processing of the preceding decimal digits of lower denominational significance. Thus, the gate 45 is closed during the processing of the TTh decimal digit.

At this time, however, a second AND gate 46, which also has the same bit output line from the element 11 connected to one of its inputs is opened by the application of the same signal on the line 33 to its second input. The output of the gate 46 is connected to a $2^{16}$ line 12 to the adder 6.

Thus, the addresses in the elements 11 and 12 which are selected as described above can lie only in the range 1,1111,0000 to 1,1111,1001 and in these locations the storage position which, in the case of the preceding decimal denomination, was used to contain the $2^0$ bit is, in the case of the TTh digit, used to hold any $2^{16}$ bit component. Since the $2^{16}$ bit is now directly available from the element 11, the $2^{16}$ output from the adder is now connected directly over a line 9 to the sum register 8 and the logic network 31 is no longer required.

In the foregoing examples, the TTh decimal digit is applied to the lines 2 (FIG. 1) on the fifth step of the conversion cycle, while the lines 3 all carry a bit of value one. It will be realised that the value represented on the lines 3 is effectively the 1's complement of a notional decimal digit '0' equivalent to a hundred-thousands digit and it will now be appreciated that the range of decimal values which may be converted may, in fact, be extended to include a hundred-thousands digit, HTh, at least up to the decimal value five, in the following way. The HTh digits 0 to 5, if subjected to 1's complementing, will have the binary values 1111 to 1010; that is, they will lie in the range 1010 to 1111, which corresponds to part of the range of addresses . . . 1010,0000 to . . . 1111,1111 previously noted as not required for use in the conversion of the preceding denominations of decimal digit pairs in the first four steps of the cycle. Moreover, the bits of denominational values $2^0$ to $2^3$ are not required in the conversion of HTh and TTh decimal denominations. A convenient terminal value for the conversion of decimal values is 524,287, a value one less than that represented by the value $2^{19}$.

Figure 3:
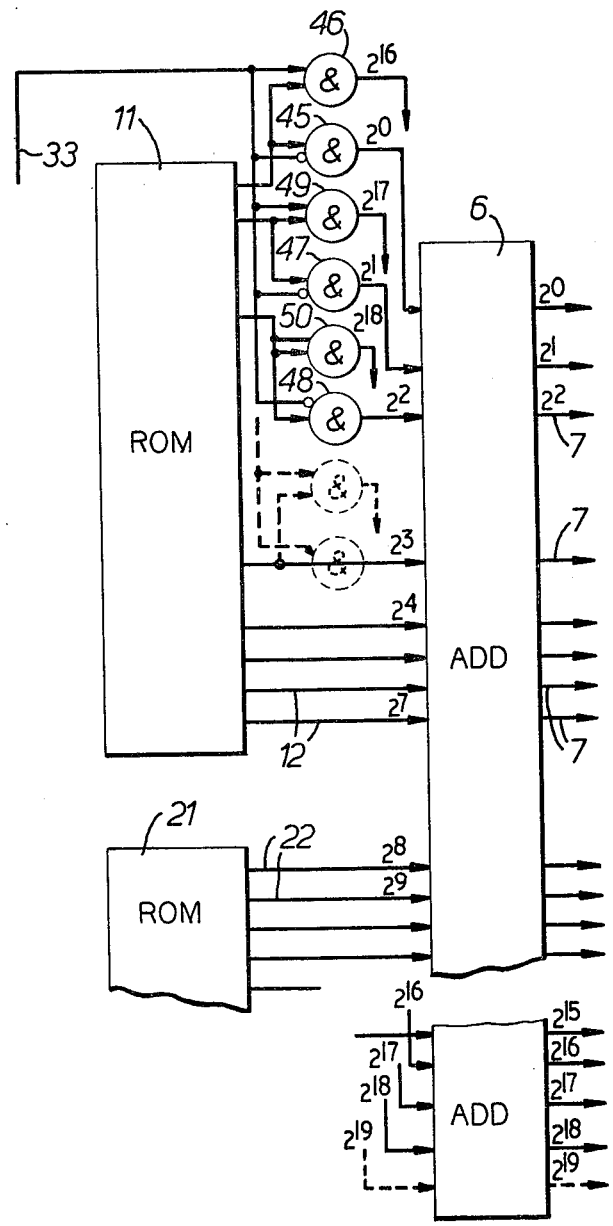
FIG. 3 shows a further modification of the arrangement.

Thus to deal with conversion of decimal values up to this termination point, the HTh decimal digit is applied to an additional group of lines 5 (omitted from FIG. 1 for the sake of clarity) which are connected to the selecting network 1. On the fifth conversion cycle, the HTh digit is connected to the more significant output lines 3, but these connections include inversion stages so that the lines 3 actually carry the 1's complement of the decimal digit. The lines 2 from the network 1 carry the TTh digit binary components as before. FIG. 3 shows the additional AND gates required to permit the use of the $2^0$ to $2^2$ output lines from the element 11 to provide the binary denominational values $2^{16}$ to $2^{18}$, in the same way as described with reference to FIG. 2 in connection with the values $2^0$ and $2^{16}$. As in the case shown in FIG. 2, the output line from the element 11 nominally carrying the $2^0$ output bit is connected through AND gate 45 to which the "fifth-cycle" control line 33 is connected through an inverting input so that the gate 45 is open throughout the earlier cycles to pass the $2^0$ output to the adder 6. In the same way, AND gates 47 and 48 also receive the line 33 signal through inverted inputs and are respectively connected to the nominal $2^1$ and $2^2$ outputs of the element 11 to pass the bits of these significances to the adder 6. Then, when the line 33 carries the "fifth-cycle" signal, the gates 45, 47 and 48 are closed and gates 46, 49 and 50, which are connected respectively to the nominal $2^0$, $2^1$ and $2^3$ outputs of the element 11 and also to the line 33, are opened to allow bits in these positions of the addressed locations to be passed to the adder 6 as bits of significance $2^{16}$, $2^{17}$ and $2^{18}$ respectively.

It will be recalled that the selecting network 1 is conveniently a multiplex switching device arranged to select the decimal digits in pairs for connection to the lines 2 and 3 (FIG. 1) as the conversion cycle progresses. It will be realised that the 1's complement of the HTh digit is readily achieved by the inclusion of inverters in the digit bit lines at their connection to the multiplex switching units. It will also be appreciated that, while the HTh digits of values 6 to 9 inclusive cannot be accommodated in the unused addresses of the elements 11 and 21 in the range 1,1010,0000 to 1,1111,1111, there is a further group of unused addresses in the range 0,1010,0000 to 0,1111,1111. It can be seen, therefore that by the inclusion of a logic network (not shown) connected to the HTh digit input lines 5 of the selecting network 1 and rendered effective by the "fifth-cycle" signal on line 33 the decimal values 6 to 9 may be detected and translated to produce address values respectively in the range, say, 1010 to 1101. Equally the detection of these values may also be used to invert the most significant address input to the elements 11 and 21 by a simple gating operation, so that all decimal values for the HTh digit produce hitherto unused address components. As noted earlier, the decimal values in excess of 524,287 require the generation of a $2^{19}$ bit. Because the $2^3$ bit cannot arise in these cases, the nominal $2^3$ output from the element 11 can be used to provide the $2^{19}$ bit in the same way as the $2^{16}$ to $2^{18}$ bits are generated. FIG. 3 shows, by broken lines the necessary provision of a pair of additional gates 49 and 50 for this purpose.

Thus the foregoing description illustrates that the fifth and sixth decimal digits, of TTh and HTh denominational significance may be converted in a binary converter having a nominal capacity of only four decimal digits by a process of decimal digit translation and the re-allocation of the binary significance of one or more positions in a stored word having a bit capacity less than that required for the accommodation of all the bit denominations required for the highest denomination decimal value to be converted.

I claim:

1. Binary-coded-decimal to binary conversion apparatus for converting a multidigit binary-coded-decimal number to its pure binary equivalent comprising:

two similar memories each having eight address lines and a further address line, corresponding address lines of the two memories being connected in common, first and second groups of storage locations, locations of the first group being addressable by address signals on said eight address lines in combination with a first signal on said further address line and locations of the second group being addressable by address signals on said eight address lines in combination with a second signal on said further address line, and a plurality of output lines;

control means operative in one step to generate said first signal and a first control signal and operative in a further step to generate said second signal and a second control signal; input means connected to said eight address lines operative in response to the first control signal in said one step to apply binary-code components of a first binary-coded-decimal digit to four of said eight address lines and binary-code components of a second binary-coded-decimal digit to the remainder of said eight address lines to address one location of the first group in each of the memories and thereby read out a pure binary equivalent of said first and second digits stored in said addressed location onto the output lines and operative in response to the second control signal in said further step to apply binary-code components of a third binary-coded-decimal digit to said four of said eight address lines and binary-code components of a fourth binary-coded-decimal digit to said remainder of said eight address lines to address one location of the second group in each of the memories and thereby read out a pure binary equivalent of said third and fourth digits stored in said addressed location onto the output lines;

and means connected to said output lines operative to sum the pure binary equivalent of said first and second digits and the pure binary equivalent of said third and fourth digits.

2. Apparatus according to claim 1 wherein the memory contains further locations addressed by a further single binary-coded-decimal digit of higher significance than the other digits, each of said further locations containing a pure binary number equivalent in value to the single binary-coded-decimal digit which addresses it, but truncated by one bit at its most significant end, the apparatus further comprising means responsive to said single digit for determining the value of said one bit and for applying said one bit to the summing means.

3. Apparatus according to claim 2 wherein the means for determining the value of said one bit comprises means for re-allocating the denominational significance of a bit storage position within each location addressed by said single digit.

4. Apparatus according to claim 2 wherein the means for determining the value of said one bit comprises a logic network.

* * * * *